(12) United States Patent
Fong et al.

(10) Patent No.: US 6,937,680 B2
(45) Date of Patent: Aug. 30, 2005

(54) SOURCE SYNCHRONOUS RECEIVER LINK INITIALIZATION AND INPUT FLOATING CONTROL BY CLOCK DETECTION AND DLL LOCK DETECTION

(75) Inventors: Wai Fong, San Jose, CA (US);
Jyh-Ming Jong, Saratoga, CA (US);
Leo Yuan, Los Altos, CA (US); Brian Smith, Sunnyvale, CA (US);
Prabhansu Chakrabarti, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 767 days.

(21) Appl. No.: 09/842,332

(22) Filed: Apr. 24, 2001

(65) Prior Publication Data

US 2002/0154718 A1 Oct. 24, 2002

(51) Int. Cl.[7] .................................................. H04L 7/00
(52) U.S. Cl. ...................... 375/357; 370/503; 327/142; 714/23; 714/55; 713/400; 713/500; 713/601; 709/228
(58) Field of Search ......................... 375/354, 356–357, 375/257; 370/503; 327/101, 142, 154; 714/21, 28, 40, 41, 43, 44, 55, 56, 775; 713/524, 400, 500, 503, 600, 601; 709/200, 220, 221, 222, 229, 232, 202

(56) References Cited

U.S. PATENT DOCUMENTS

| | | | |
|---|---|---|---|
| 5,774,001 A | * | 6/1998 | Mozdzen et al. ........... 327/141 |
| 5,886,582 A | | 3/1999 | Stansell |
| 5,973,525 A | | 10/1999 | Fujii |
| 6,016,066 A | | 1/2000 | Ilkbahar |
| 6,131,168 A | | 10/2000 | Krzyzkowski |
| 6,178,206 B1 | | 1/2001 | Kelly et al. |
| 6,181,174 B1 | | 1/2001 | Fujieda et al. |
| 6,198,689 B1 | * | 3/2001 | Yamazaki et al. ........... 365/233 |
| 6,209,069 B1 | * | 3/2001 | Baltar ........................ 711/163 |
| 6,233,200 B1 | * | 5/2001 | Knoll et al. ................ 365/233 |

FOREIGN PATENT DOCUMENTS

EP    0 798 861 A1    3/1997

OTHER PUBLICATIONS

International Search Report Application No. PCT/US 02/12713, mailed Jul. 23, 2002.
"External Clock Failure Detection in Communication Networks", Bigo, et al, IBM Technical Disclosure Bulletin, IBM Corp., New York, vol. 26, No. 10B, Mar. 1984, p. 5686.

* cited by examiner

*Primary Examiner*—Dac V. Ha
(74) *Attorney, Agent, or Firm*—Meyertons Hood Kivlin Kowert & Goetzel, P.C.; B. Noël Kivlin; Erik A. Heter

(57) ABSTRACT

A method and apparatus for operating a source synchronous receiver. In one embodiment, a source synchronous receiver may include a clock receiver comprising a clock detector and a clock signal buffer. The clock detector may be configured to detect a first clock signal and assert a clock detect signal responsive to detecting the first clock signal. The clock buffer may receive the first clock signal and produce a second clock signal, which may be driven to a digital locked loop (DLL) circuit, where the second clock signal is regenerated and driven to a data buffer of the source synchronous receiver. The clock detect signal may be received by a clock verification circuit. The clock verification circuit may be configured to initiate a reset of the source synchronous receiver upon a failure to receive the clock detect signal. The resetting of the source synchronous receiver may be performed locally, and does not reset the core logic of the device in which it is implemented, nor any other source synchronous port on the device. Thus, other source synchronous ports on the device, as well as the core logic, may be able to continue operations as normal. The method and apparatus may include a source synchronous receiver that is hot-swappable.

33 Claims, 4 Drawing Sheets

SOURCE SYNCHRONOUS RECEIVER LINK INITIALIZATION AND INPUT FLOATING CONTROL BY CLOCK DETECTION AND DLL LOCK DETECTION

BACKGROUND OF THE INVENTION

1. Field of the Invention

This invention relates to electronic circuits, and more particularly, clock circuits for providing timing signals.

2. Description of the Related Art

As the operating speed of computer processors has increased, the operating speeds of system boards implementing these processors has increased as well in order to eliminate or reduce the effects of bottlenecks. With the clock speeds of processors approaching 1 GHz it is not uncommon for system boards to operate at a clock speed exceeding 100 MHz.

Source synchronous I/O may eliminate or minimize problems that may occur when the data transfers a synchronized to a single system clock. Source synchronous I/O may allow more flexibility in designing system boards, as the clock speed used by source synchronous I/O lines may scale with the processor clock speeds. Furthermore, the use of source synchronous I/O may eliminate length constraints on signal lines.

In a source synchronous data transfer, the device transferring the data may also generate and transfer a clock signal along with the data. The receiving device may receive the clock signal from the source, and may thereby synchronize the data transfer with the received clock. This may allow the clock lines between two devices to be much shorter in length, thereby eliminating much of the clock skew that may otherwise occur.

While source synchronous I/O may be useful in minimizing or eliminating the clock skew problems that occur when data transfers are synchronized to a single system clock, other problems may arise. One such problem may be noise, as the increased number of clock signals present on the board may create unwanted electromagnetic noise. Such noise may cause problems with some source synchronous clock signals, such as clock jitter. The problems that arise with source synchronous I/O may result in the need to repeat some data transfers. Repeating a data transfer in some cases may require a reset to the device to which the data was to be transferred. This may result in a severe performance penalty for the system in which the source synchronous device is implemented.

SUMMARY OF THE INVENTION

The problems outlined above may in large part be solved by a method and apparatus for operating a source synchronous receiver. In one embodiment, a source synchronous receiver may include a clock receiver comprising a clock detector and a clock signal buffer. The clock detector may be configured to detect a first clock signal and assert a clock detect signal responsive to detecting the first clock signal. The clock buffer may receive the first clock signal and produce a second clock signal, which may be driven to a digital locked loop (DLL) circuit, where the second clock signal is regenerated and driven to a data buffer of the source synchronous receiver. The clock detect signal may be received by a clock verification circuit. The clock verification circuit may be configured to initiate a reset of the source synchronous receiver upon a failure to receive the clock detect signal. The resetting of the source synchronous receiver may be performed locally, and does not reset the core logic of the device in which it is implemented, nor any other source synchronous port on the device. Thus, other source synchronous ports on the device, as well as the core logic, may be able to continue operations as normal. Furthermore, initializing a link to source synchronous I/O port on another chip does not require a reset of that chip. Thus, the source synchronous receiver may be ideal for hot swap environments.

A source synchronous receiver of one embodiment may include clock circuits, one or more DLL circuits, a data buffer, and read and write pointer control logic. Resetting the source synchronous receiver may comprise placing the output of all state machines (i.e. DLL circuits, data buffers, etc.) into an idle state, and placing all logic interface outputs to the core logic into an inactive, or de-asserted state. For example, in one embodiment, resetting may comprise placing the interface outputs to the core logic in a logic zero state. Resetting may also comprise removing power to various portions of the source synchronous receiver.

In one embodiment, the DLL circuit may be configured to assert a lock detect signal, which may be received by the clock verification circuit. The clock verification circuit may assert a DLL lock signal responsive to receiving both the clock detect signal and the lock detect signal. The DLL lock signal may be driven to a status register in the core logic of the integrated circuit (IC) in which the source synchronous receiver is implemented, which may indicate to the core logic that the source synchronous receiver is operating. Upon failure to receive either an asserted clock detect or lock detect signal from the clock detector or DLL circuit, respectively, the clock verification circuit may de-assert the DLL lock signal, which may cause the source synchronous receiver to be reset (i.e. the output of all logic circuits set to a logic '0'). In one embodiment, the de-assertion of the DLL lock signal may effect the reset by causing a receiver reset signal to be asserted, wherein the receiver reset signal is asserted as a logic '0', or as a logic low level voltage. The clock verification circuit may also be configured to assert a receiver enable signal, which causes various circuitry such as the clock signal buffer to be powered up. Upon failure of the clock verification circuit to receive the clock detect circuit, the receiver enable signal may be de-asserted, thereby causing power to be cut off from the clock signal buffer.

The first clock signal may be a differential clock signal. The first clock signal may be converted to a second clock signal by the clock signal buffer. The second clock signal may be a single-ended clock signal. In one embodiment, an analog comparator may be used to implement the clock signal buffer. The analog comparator may compare the voltage levels on the differential inputs and generate the second clock signal based on the varying voltage levels. Since the analog comparator may consume a large amount of power relative to other circuitry in the source synchronous receiver, it may be powered down when the receiver enable signal is de-asserted. Upon receiving the second clock signal, the DLL circuit may then lock onto and regenerate the second clock signal, thereby producing a clean, noise free clock for the data buffer of the source synchronous receiver.

Thus, in various embodiments, the source synchronous receiver may solve some of the problems associated with source synchronous I/O. The ability to perform a local reset may allow other source synchronous circuits and the core logic of an integrated circuit or other device to continue operation in the event it is necessary the source synchronous receiver.

BRIEF DESCRIPTION OF THE DRAWINGS

Other objects and advantages of the invention will become apparent upon reading the following detailed description and upon reference to the accompanying drawings in which.

Figure 1:
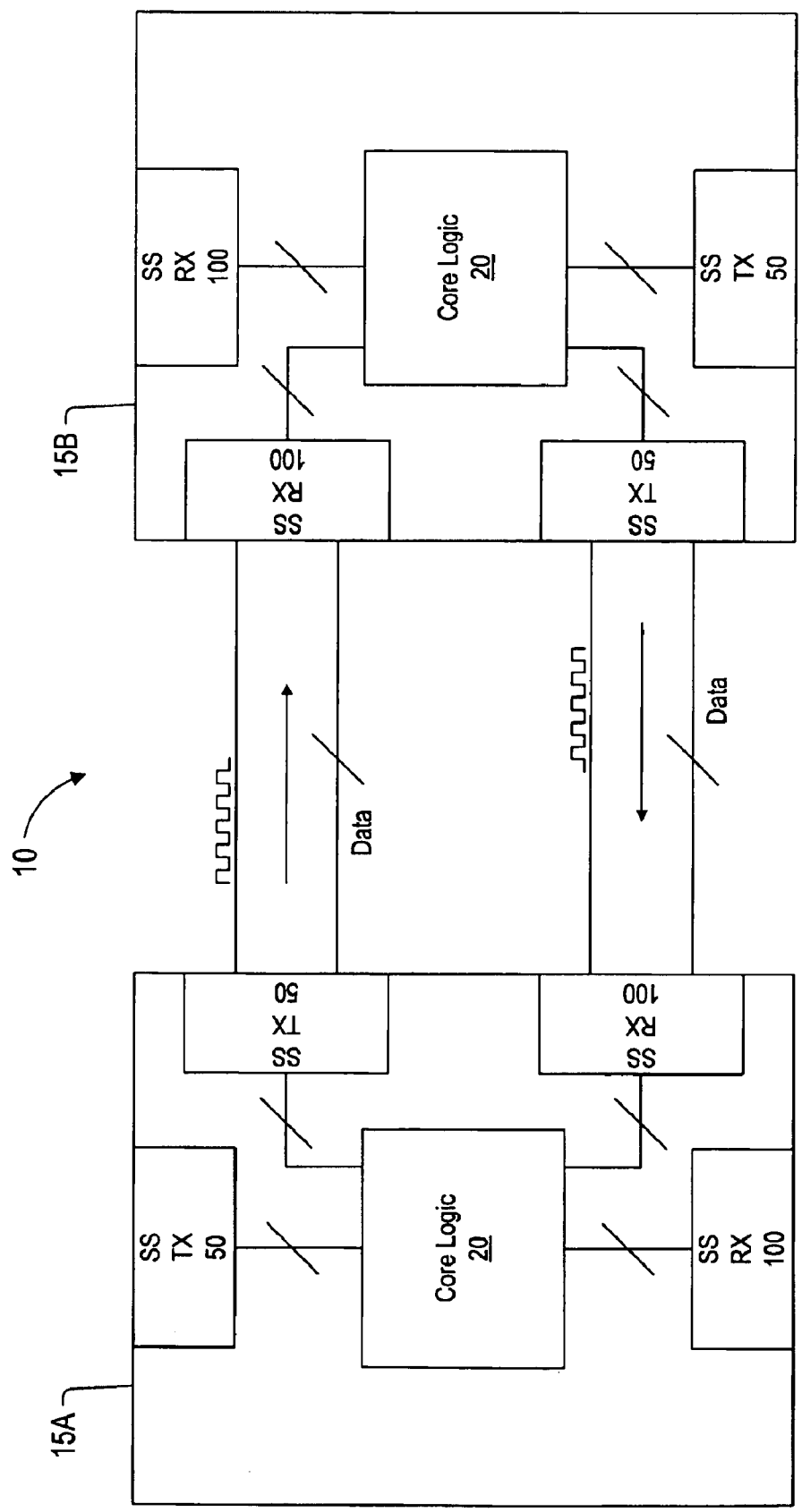
FIG. 1 is a block diagram illustrating one embodiment of a system utilizing source synchronous I/O.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Moving now to FIG. 1, a block diagram illustrating one embodiment of a system utilizing source synchronous I/O is shown. System 10 is an exemplary system which includes two integrated circuits (ICs) 15A and 15B that are configured for source synchronous I/O operations. Each IC includes a plurality of source synchronous transmitters (SST's) 50 and source synchronous receivers (SSR's) 100. Each SST 50 and SSR 100 is coupled to core logic 20 of its respective IC.

IC's 15A and 15B may be any type of integrated circuit that may be configured for source synchronous communications. Examples of such IC's include processors, application specific integrated circuits (ASICs), peripheral chips, and so on. The primary functions of each of IC 15A and IC 15B may be performed by its core logic 20. IC's 15A and 15B may be implemented on a system board (i.e. motherboard) of a computer system. IC's 15A and 15B may also be implemented on various daughter cards or in peripheral devices. It should also be noted that it is not necessary that IC 15A and IC 15B be on the same board in order to conduct source synchronous communications with each other. For example, it may be possible for IC 15A to be mounted on a daughter card to conduct source synchronous communications with a IC 15B, which may be mounted on a main system board.

In the embodiment shown, an SST 50 of IC 15A is coupled to an SSR 100 of IC 15B by a one or more data lines 80 and a clock line 90. In order to transfer data from IC 15A to IC 15B, data may first be moved from the core logic 20 of IC 15B to an SST 50. When SST 50 is ready for transferring data, it may utilize a continuously running clock signal which is conveyed along clock line 90 to an SSR 100 of a second IC 15. The clock signal generated by the source SST 50 may be used to synchronize the data transmission. Data may be transmitted by SST 50 over data lines 80 to SSR 100 of IC 15B. SSR 100 may receive both the clock signal and the data, with the clock signal being used to synchronize the receiving of data from the source SST 50.

Each of IC's 15A and 15B may be configured for hot swap environments. In addition to the necessary power circuitry, each of the source synchronous I/O ports (SST's 50 and SSR's 100) may be configured for hot swap environments. Each of SST's 50 and SSR's 100 may be reset individually, without resetting the core logic or other source synchronous I/O ports on the chip. Furthermore, each of SST's 50 and SSR's 100 may be configured for establishing links with source synchronous P/O ports on other chips without requiring a reset of other portions of the chip, including the core logic. In various embodiments, it may also be possible to turn off an individual SST 50 or SSR 50 without removing power or resetting the core logic or other source synchronous I/O ports of the chip or other chips to which it may be linked. Additional details of resetting SSR's 100 will be described in further detail below.

Figure 2:
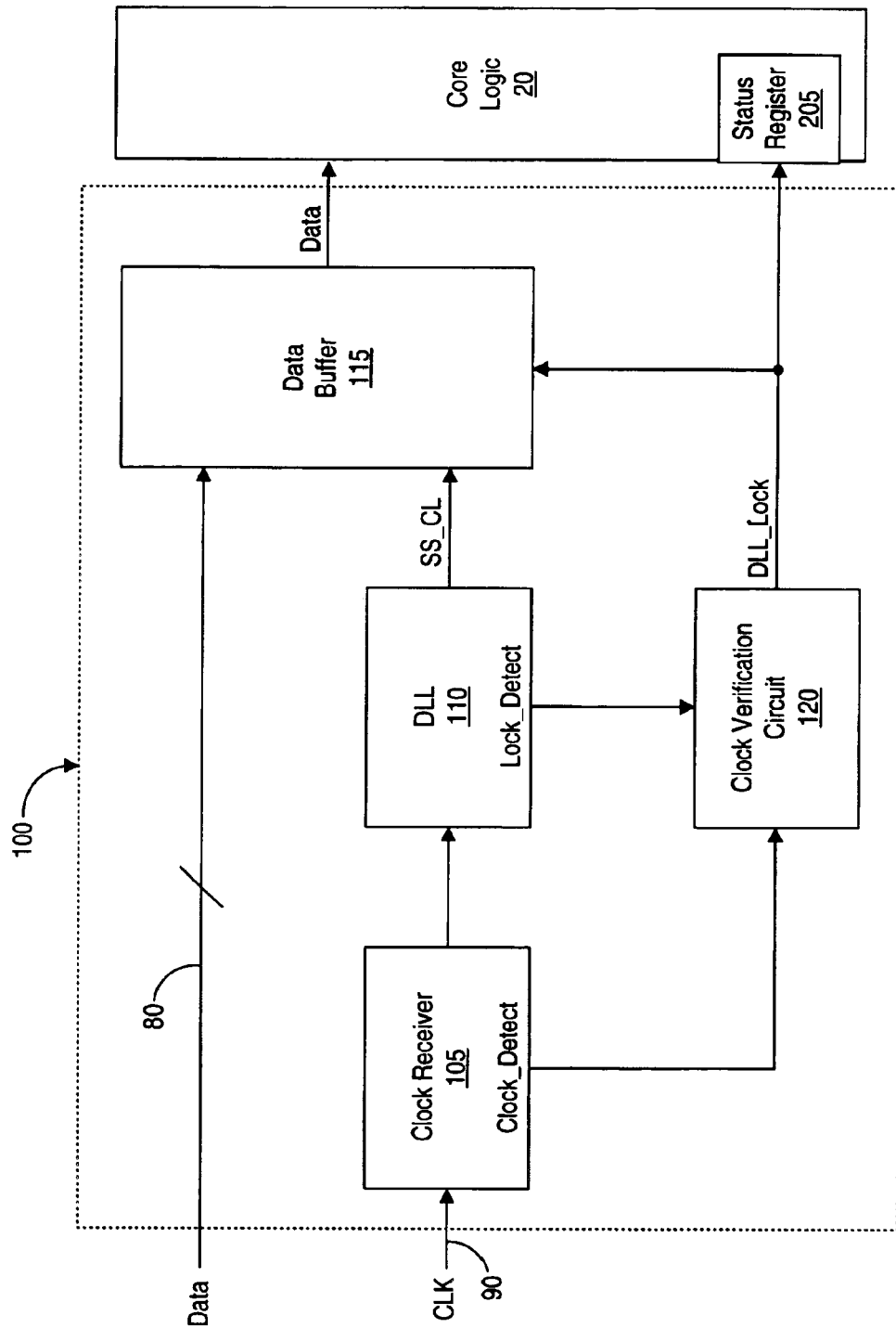
FIG. 2 is a block diagram of one embodiment of a source synchronous receiver.

Turning now to FIG. 2, a block diagram of one embodiment of a source synchronous receiver. SSR 100 is configured to receive data via one or more data lines 80. Data may be received by data buffer 115 of SSR 100. In order to synchronize the reception of data, SSR 100 may receive a first clock signal from a source synchronous transmitter via a clock line 90, and produce a second clock signal. The clock signal may initially be received by a clock receiver 105. Responsive to receiving the first clock signal, clock receiver 105 may assert a clock detect signal, which may be forwarded to a clock verification circuit 120. Clock receiver 105 may also perform signal conversion on the received clock signal, as will be discussed in further detail below.

SSR 100 also includes a DLL circuit 110 which is configured to receive the second clock signal from clock receiver 105. DLL circuit 110 may regenerate the second clock signal, which may then be driven to a data buffer 115 in order to synchronize the reception of data from a source synchronous transmitter. DLL circuit 110 may also assert a lock detect signal. The lock detect signal may be asserted when DLL circuit 110 has received and locked onto the first clock signal, thereby producing the second clock signal. The lock detect signal may be driven to clock verification circuit 120.

Clock verification circuit 120 may assert a DLL lock signal responsive to receiving the clock detect signal 105 from clock receiver 105. In some embodiments, the DLL lock signal may be asserted responsive to receiving both the clock detect signal and the lock detect signal from DLL circuit 110. The DLL lock signal may be driven to status register 205 in core logic 20. Status register 205 may be configured to store status bits for a number of source synchronous receivers. A status bit may be set when status register 205 receives an asserted DLL lock signal from the clock verification circuit. When the status bit associated with SSR 100 is set, it may indicate that a valid clock signal is being received by the SSR 100, and may thereby provide a status to software prior to enabling the source synchronous link.

SSR 100 also includes data buffer 115. Data buffer 115 may be configured to receive data through one or more data lines 80. Data buffer 115 may also be configured to receive the second clock signal from DLL circuit 110, which may enable data buffer 115 to receive data synchronously from a source synchronous transmitter. After receiving data, data buffer 115 may then forward the data to core logic 20.

In one embodiment, clock verification circuit 120 may be configured to de-assert the DLL lock signal upon a failure to receive an asserted clock detect signal from clock receiver 105. The de-assertion of the DLL lock signal may cause SSR 100 to be put into a reset state. The reset state may comprise resetting the outputs of all logic circuits in the data buffer to a logic '0'. In some embodiments, resetting SSR 100 may comprise powering down one or more of the components of SSR 100. This may include powering down one or more of the data buffer 115, DLL circuit 110, clock verification circuit 120, and portions of clock receiver 105. It should also noted that a reset of the source synchronous receiver may be a local reset and thus does not cause a reset of other components of the integrated circuit in which SSR 100 is implemented.

Figure 3:
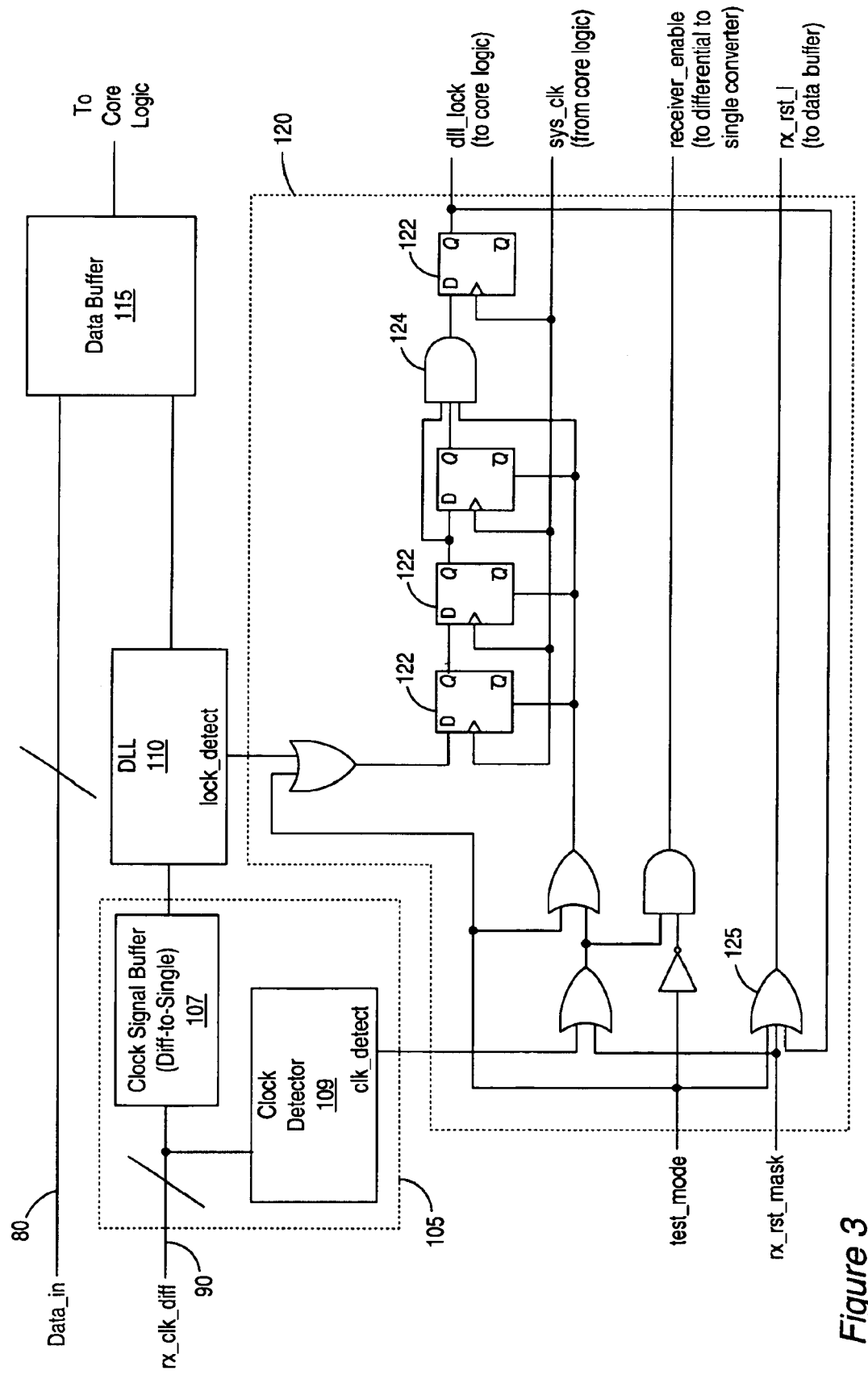
FIG. 3 is a schematic diagram illustrating a circuit configuration for one embodiment of a source synchronous receiver.

Moving now to FIG. 3, a schematic diagram illustrating a circuit configuration for one embodiment of a source synchronous receiver is shown. Similar to the embodiment shown in FIG. 2, SSR 100 includes a clock receiver 105, a DLL circuit 110, a clock verification circuit 120, and a data buffer 115.

In the embodiment shown, clock receiver 105 includes clock signal buffer 107 and clock detector 109. In this particular example, clock signal buffer 107 may be a differential to single converter. Clock receiver 105 may be configured to receive a differential clock signal, and thus, clock line 90 may include two physical lines to transmit the differential clock signal. It should be noted that alternate embodiments, wherein the received clock signal is a single-ended clock signal, are possible and contemplated. Clock signal buffer 107 may be configured to convert a received differential clock signal into a single ended clock signal. In one embodiment, an analog comparator or other type of differential amplifier may be used to convert the differential clock signal into a single ended clock signal. Clock signal buffer may boost the signal strength of the single ended clock signal prior to driving it to DLL circuit 110. Clock receiver 105 also includes clock detector 109. Clock detector 109 may assert a clock detect signal (clk_detect) responsive to receiving the differential clock signal.

DLL circuit 110, in the embodiment shown, is configured to receive the single-ended clock signal from clock signal buffer 105. DLL circuit 110 may be a phase-locked loop circuit, and may be optimized for square wave signals such as the single-ended clock signal. DLL circuit 100 may regenerate the single-ended clock signal and boost it's signal strength for driving it to data buffer 115. Using DLL circuit 110 to regenerate the single-ended clock signal may result in a cleaner and relatively noise free clock signal. DLL circuit 110 may also assert a lock detect signal (lock_detect) upon obtaining a lock on the single-ended clock signal received from clock signal buffer 107.

Clock verification circuit 120 may be configured to receive the clock detect signal from clock detector 109 and the lock detect signal from DLL circuit 110. The lock detect signal may be routed through a chain of serially coupled flip-flops 122. Flip-flops 122 may be synchronized by a third clock signal (sys_clk) that may be received from the core logic of IC in which SSR 100 is implemented. The third clock signal may be separate from the first or second clock signals (i.e. the differential and single-ended clock signals, respectively). By using the serially coupled chain of flip-flops 124, clock verification circuit 120 may be able to ensure that the DLL circuit has maintained a lock on the single-ended clock signal received from clock signal buffer 107 for a plurality of clock cycles.

A DLL lock signal (dll_lock) may be asserted by clock verification circuit 120. In the embodiment shown, the DLL lock signal may be asserted by flip-flop 122F. Each of flip-flops 122 and 122F in this embodiment is a D-type flip-flop, although other types may be used. Three-input AND gate 124 may provide the input to flip-flop 122F. The output of three-input AND gate 124 may become a logic '1' when the clock detect signal has propagated the two-input OR gates (to an input of the AND gate) and three clock cycles have completed after the initial assertion of the DLL lock signal by DLL circuit 110.

If either the clock detect signal or the lock detect signal is de-asserted in this particular embodiment, the DLL lock signal may also be de-asserted. This may cause a reset of SSR 100. For this particular embodiment, de-assertion of the DLL lock signal may cause a receiver reset signal (rx_rst_1) to become a logic '0'. The output of flip-flop 122F is configured to propagate to three-input OR gate 125, which also receives inputs test_mode and rx_rst_mask (which are de-asserted, or logic '0', during normal operation of SSR 100). When rx_rst_1 becomes a logic '0', the resulting reset may cause the output of all logic circuits in data buffer 115 to be reset to a logic '0' state. It may also be possible to identify the source of a clocking problem by observation of the clock detect and lock detect signals. If a reset results from the de-assertion of the lock detect signal, it may indicate that DLL 110 is unable to obtain a lock upon a clock signal, even though clock detector 109 has detected an input clock signal. For example, if the input clock singnal has a high amount of jitter, or is not at the correct frequency, it may be detected by clock detector 109, although it may not be possible for DLL circuit 110 to obtain a lock. If a reset occurs due to a de-assertion of the clock detect signal, it may be an indication of a problem with the input clock signal or a broken clock line.

If the resetting of SSR 100 is caused by a de-assertion of the clock detect signal, clock verification circuit 120 may be configured to cause the powering down of certain components of SSR 100. In one embodiment, the de-assertion of the clock detect signal due to a failure to detect the first clock signal may cause a de-assertion of a receiver enable signal (receiver_enable), as shown in the drawing. Although not explicitly shown here, the receiver enable signal may be used to control power to clock signal buffer 107. Power may be applied to clock signal buffer 107 when the receiver enable signal is asserted, and removed when the receiver enable signal is de-asserted. In some embodiments, power may be removed from other components as well. Some embodiments may also remove power from a portion of, or all of clock verification circuit 120. The supply of power may be resumed upon detection of the first clock signal by clock detect circuit 109 and the re-assertion of the clock detect signal. Embodiments wherein DLL circuit 110, clock verification circuit 120, and/or data buffer 115 are powered down during some reset conditions are possible and contemplated. In one embodiment, failure of clock detector 109 to assert the clock detect signal may result in the absence of power to clock signal buffer 107, DLL circuit 110, and data buffer 115. The ability to power down and power up various components of the source synchronous receiver dependent upon detection of the first clock signal may make the source synchronous receiver ideal for hot swap environments.

In some cases, clock verification circuit 120 may be inhibited from performing a reset of the source synchronous receiver. In the embodiment shown, this may occur as a result of receiving a test mode signal (test_mode) or a receiver reset mask (rx_rst_mask) signal. When the test mode signal is asserted, its value may propagate through three-input OR gate 125, causing the receiver reset signal to remain a logic '1' regardless of whether clock detector 109 detects an input clock signal. Assertion of the test mode signal may also cause the receiver enable signal to be de-asserted, thereby cutting power to clock signal buffer 107. The test mode signal may enable testing to be conducted on various components of the source synchronous receiver, such as data buffer 115, and may further prevent source synchronous receiver 10 from interfering with other tests that are being conducted within the integrated circuit. Clock verification circuit 120 may also be inhibited from causing a reset when the receiver reset mask signal is asserted. The receiver reset mask signal may propagate through three-input OR gate 125, thereby causing the receiver reset signal to remain a logic '1'.

Figure 4:
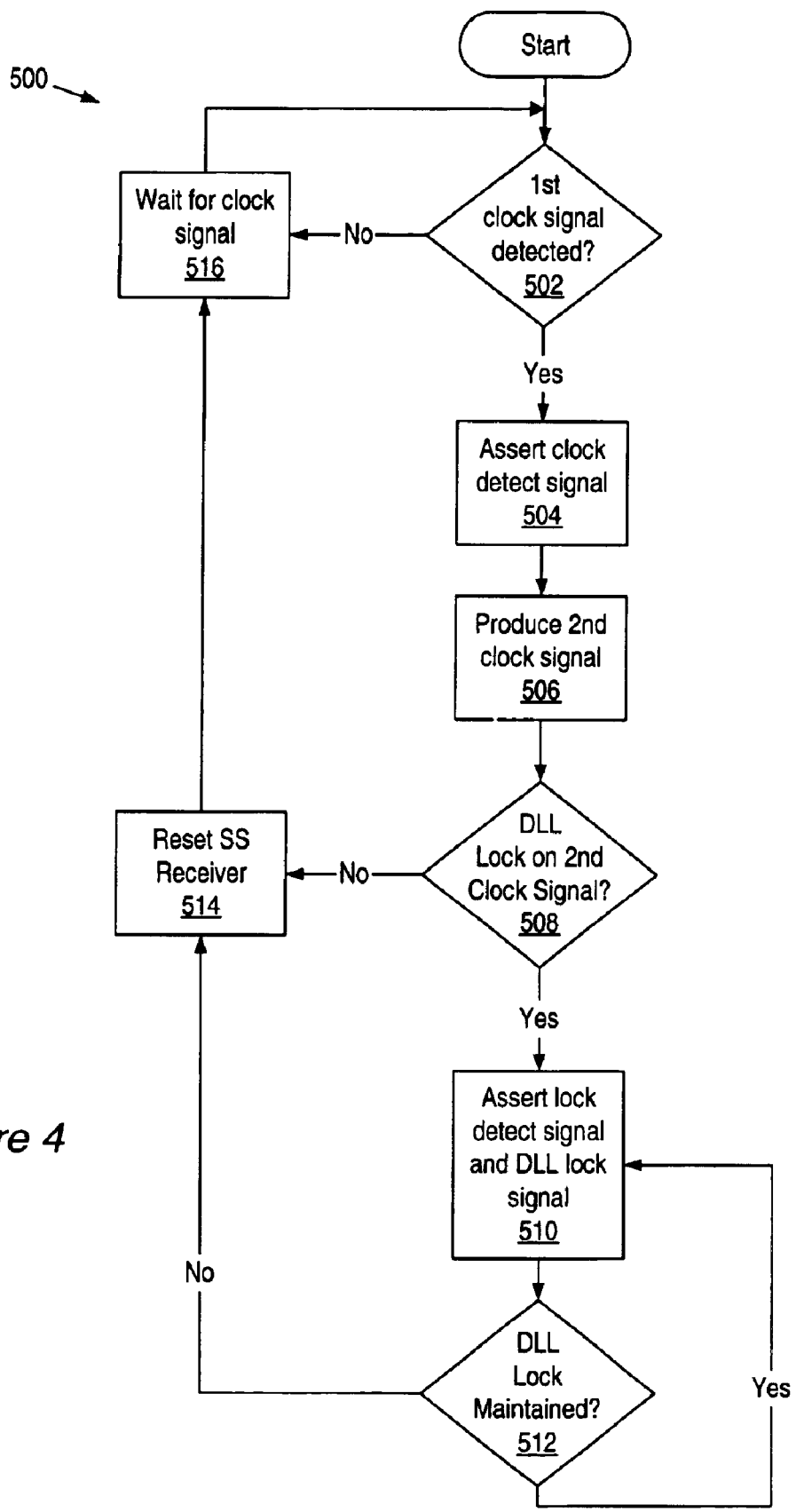
FIG. 4 is a flow diagram illustrating the operation of one embodiment of a source synchronous receiver.

Moving now to FIG. 4, a flow diagram illustrating the operation of one embodiment of a source synchronous receiver is shown. Alternate embodiments of the method are possible and contemplated. Method 500 begins with the detection of a first (i.e. input) clock signal (Step 502). The input clock signal may be either a differential or single-ended clock signal, and may be detected by a clock detector circuit. Detection of the input clock signal may result in the assertion of a clock detect signal by the clock detector circuit (Step 504). The clock detect signal may drive the clock detect signal to a clock verification circuit, such as that of FIGS. 2 and 3. The method may also produce a second clock signal based on the first clock signal (Step 506). It should be noted that while the flow diagram shows Steps 502, 504 and 506 as occurring sequentially, these steps may occur concurrently. Production of the second clock signal may include the conversion of a differential clock signal into a single ended clock signal. Embodiments where both the first and second clock signals are single-ended are also possible and contemplated. Production of the second clock signal may also involve boosting the clock signal strength or producing a second clock signal having a different frequency from the first clock signal.

The second clock signal may be driven to a DLL circuit, which then attempts to obtain a lock on the signal (Step 508). The DLL circuit may be used to re-generated the second clock signal, thereby producing a signal that is relatively clean and noise-free. If the DLL circuit obtains a lock, it may assert a DLL lock signal (Step 510). The source synchronous receiver may continue operating as normal as long as the DLL circuit is able to maintain a lock on the clock signal, with the exception of certain situations (e.g. the assertion of the test mode signal as discussed in reference to FIG. 3).

In Step 508, if the DLL fails to obtain a lock on the clock signal, a reset of the source synchronous receiver may be performed (Step 514). Similarly, if the DLL circuit, having previously obtained a lock, loses the lock on the clock signal in Step 512, it may also result in a reset of the source synchronous receiver. A loss of the lock in Step 512 may occur for various reasons, and may include the loss of detection of the input clock signal by clock detector circuit. The DLL circuit may also lose a lock if the input clock signal becomes too jittery, or if its frequency drifts out of a predetermined range.

Following a reset of the source synchronous receiver, the method may then wait for a clock signal to be detected (Step 516), and then return to Step 502. Thus, a reset of the source synchronous receiver may result in a restarting of method 500 from the beginning.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A source synchronous receiver comprising:
   a data buffer configured to receive data through one or more signal lines;
      a clock receiver comprising a clock signal buffer and a clock detector, wherein the clock signal buffer is configured to receive a first clock signal and drive a second clock signal responsive to receiving the first clock signal, and wherein the clock detector is configured to assert a clock detect signal responsive to receiving the first clock signal;
   a digital locked loop (DLL) circuit configured to receive the second clock signal from the clock buffer, wherein the DLL circuit is configured to drive the second clock signal to the data buffer;
   a clock verification circuit, wherein the clock verification circuit is configured to receive the clock detect signal from the clock detector, and wherein the clock verification circuit is configured to reset the source synchronous receiver responsive to a failure to receive clock detect signal.

2. The source synchronous receiver as recited in claim 1, wherein the DLL circuit is configured to assert a lock detect signal, and wherein the clock verification circuit is further configured to reset the source synchronous receiver responsive to a failure of the clock verification circuit to receive the lock detect signal.

3. The source synchronous receiver as recited in claim 2, wherein the clock verification circuit is configured to assert a DLL lock signal responsive to receiving both the clock detect signal and the lock detect signal, and wherein the clock verification circuit is configured to reset the source synchronous receiver by de-asserting the DLL lock signal.

4. The source synchronous receiver as recited in claim 2, wherein resetting the source synchronous receiver includes powering down the clock signal buffer responsive to a failure of the clock detector failing to detect the first clock signal.

5. The source synchronous receiver as recited in claim 4, wherein the clock signal buffer is powered on responsive to the clock detector detecting the first clock signal.

6. The source synchronous receiver as recited in claim 2, wherein the source synchronous receiver is coupled to the core logic of an integrated circuit, wherein the core logic is configured to receive data from the data buffer.

7. The source synchronous receiver as recited in claim 6, wherein the clock verification circuit is configured to drive the DLL lock signal to a status register in the core logic.

8. The source synchronous receiver as recited in claim 2, wherein the clock verification circuit includes a chain of serially coupled flip-flops, wherein the chain includes at least two flip-flops.

9. The source synchronous receiver as recited in claim 8, wherein the clock verification circuit is configured to receive a third clock signal, wherein each of the flip-flops receives the third clock signal.

10. The source synchronous receiver as recited in claim 9, wherein the DLL lock signal is not asserted until at least two cycles of the third clock signal have completed.

11. The source synchronous receiver as recited in claim 1, wherein the first clock signal is a differential clock signal and the second clock signal is a single-ended clock signal.

12. The source synchronous receiver as recited in claim 1, wherein the source synchronous receiver is configured to be hot swappable.

13. The source synchronous receiver as recited in claim 1, wherein the clock verification circuit is further configured to assert a receiver enable signal.

14. The source synchronous receiver as recited in claim 13, wherein the clock verification circuit is further configured to receive a test mode signal, and wherein the receiver enable signal is de-asserted responsive to the clock verification responsive to receiving the test mode signal, and wherein the clock verification circuit is inhibited from resetting the source synchronous receiver responsive to receiving the test mode signal.

15. The source synchronous receiver as recited in claim 1, wherein the clock verification circuit is further configured to receive a reset mask signal, wherein the clock verification circuit is configured to inhibit a reset of the source synchronous receiver responsive to receiving the reset mask signal.

16. The source synchronous receiver as recited in claim 1, wherein the DLL circuit and the clock verification circuit are powered down responsive to a failure of the clock detect circuit to detect the first clock signal.

17. The source synchronous receiver as recited in claim 1, wherein the clock verification circuit is configured to perform a local reset of the source synchronous receiver.

18. A method for operating a source synchronous receiver, the method comprising detecting a first clock signal with a clock detector;

producing a second clock signal responsive to a clock signal buffer receiving the first clock signal, and regenerating the second clock signal using a digital locked loop (DLL) circuit;

driving the second clock signal to a data buffer, wherein the data buffer is configured to receive data through one or more data lines;

receiving a clock detect signal from the clock detector, wherein said receiving the clock detect signal is performed by a clock verification circuit;

resetting the source synchronous receiver responsive to a failure of the clock verification circuit to receive the clock detect signal.

19. The method as recited in claim 18 wherein the DLL circuit is configured to assert a lock detect signal, and wherein the clock verification circuit is further configured to reset the source synchronous receiver responsive to a failure of the clock verification circuit to receive the lock detect signal.

20. The method as recited in claim 19, wherein the clock verification circuit is further configured to assert a DLL lock signal.

21. The method as recited in claim 20 further comprising de-asserting the DLL lock signal responsive to a failure of the clock verification circuit to receive the clock detect signal or the lock detect signal, wherein said de-asserting the DLL lock signal causes the resetting of the source synchronous receiver.

22. The method as recited in claim 20 further comprising the clock verification circuit driving the DLL lock signal to a status register, wherein the status register is located in core logic of an integrated circuit, and wherein the source synchronous receiver is coupled to the core logic.

23. The method as recited in claim 22 further comprising delaying said driving of the DLL lock signal by two or more clock cycles of a third clock signal, wherein the clock verification circuit includes a chain of serially coupled flip-flops including at least two flip-flops, and wherein each of the flip-flops is configured to receive the third clock signal.

24. The method as recited in claim 18 further comprising powering down the clock signal buffer responsive to the clock detector failing to detect the first clock signal.

25. The method as recited in claim 24 further comprising powering on the clock signal buffer responsive to the clock detector detecting the first clock signal.

26. The method as recited in claim 18, wherein the first clock signal is a differential signal and the second clock signal is a single-ended signal.

27. The method as recited in claim 18 further comprising the clock verification circuit asserting a receiver enable signal.

28. The method as recited in claim 27, wherein the clock verification circuit is configured de-assert the receiver enable signal responsive to receiving a test mode signal.

29. The method as recited in claim 28 further comprising inhibiting the clock verification circuit from resetting the source synchronous receiver responsive to said receiving a test mode signal.

30. The method as recited in claim 18 further comprising inhibiting the clock verification circuit from resetting the source synchronous receiver responsive to receiving a reset mask signal.

31. The method as recited in claim 18 further comprising powering down the DLL circuit and the clock verification circuit responsive to a failure of the clock detector to detect the first clock signal.

32. The method as recited in claim 31 further comprising powering on the DLL circuit and the clock verification circuit responsive to the clock detector detecting the first clock signal.

33. The method as recited in claim 18, wherein said resetting the source synchronous receiver is performed locally.

* * * * *